United States Patent
Farris, III

(10) Patent No.: US 8,075,723 B1
(45) Date of Patent: *Dec. 13, 2011

(54) LASER SEPARATION METHOD FOR MANUFACTURE OF UNIT CELLS FOR THIN FILM PHOTOVOLTAIC MATERIALS

(75) Inventor: Chester A. Farris, III, Yorba Linda, CA (US)

(73) Assignee: Stion Corporation, San Jose, CA (US)

( * ) Notice: Subject to any disclaimer, the term of this patent is extended or adjusted under 35 U.S.C. 154(b) by 165 days.

This patent is subject to a terminal disclaimer.

(21) Appl. No.: 12/389,201

(22) Filed: Feb. 19, 2009

Related U.S. Application Data

(60) Provisional application No. 61/033,406, filed on Mar. 3, 2008.

(51) Int. Cl.
*B32B 37/00* (2006.01)
*B32B 38/04* (2006.01)

(52) U.S. Cl. ............... 156/253; 156/256; 156/272.8; 438/57; 438/66; 257/E21.415; 257/E27.112

(58) Field of Classification Search ............... 156/253, 156/256, 272.8; 438/57, 66; 257/E21.415, 257/E27.112, E31.052
See application file for complete search history.

(56) References Cited

U.S. PATENT DOCUMENTS

| | | |
|---|---|---|
| 4,335,266 A | 6/1982 | Mickelsen et al. |
| 4,441,113 A | 4/1984 | Madan |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,532,372 A | 7/1985 | Nath et al. |
| 4,542,255 A | 9/1985 | Tanner et al. |
| 4,581,108 A | 4/1986 | Kapur et al. |

(Continued)

FOREIGN PATENT DOCUMENTS

AU 734676 2/1999

(Continued)

OTHER PUBLICATIONS

Chopra et al., Thin-Film Solar Cells: An Overview, 2004, Progress in Photovoltaics: Research and Applications, 2004, vol. 12, pp. 69-92.

(Continued)

*Primary Examiner* — Linda L Gray
(74) *Attorney, Agent, or Firm* — Kilpatrick Townsend & Stockton LLP

(57) ABSTRACT

A method for manufacture of unit cells for thin film photovoltaic materials includes providing an optically transparent substrate having a thickness, a back surface region, and a front surface region including one or more grid-line regions. The method further includes forming a layered structure including photovoltaic materials overlying a metal layer on the front surface region. Additionally, the method includes aligning a laser beam from the back surface region through the thickness of the optically transparent substrate to illuminate a first region within the one or more grid-line regions and subjecting a portion of the metal layer overlying the first region in the laser beam to separate a first portion of the layered structure from the first region. The method further includes scanning the laser beam along the one or more grid-line regions to cause formation of one or more unit cells of the layered structure and providing the one or more unit cells.

13 Claims, 8 Drawing Sheets

U.S. PATENT DOCUMENTS

| | | | |
|---|---|---|---|
| 4,589,194 A | 5/1986 | Roy |
| 4,589,918 A | 5/1986 | Nishida |
| 4,598,306 A | 7/1986 | Nath et al. |
| 4,599,154 A | 7/1986 | Bender et al. |
| 4,611,091 A | 9/1986 | Choudary et al. |
| 4,612,411 A | 9/1986 | Wieting et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,724,011 A | 2/1988 | Turner et al. |
| 4,751,149 A | 6/1988 | Vijayakumar et al. |
| 4,775,425 A | 10/1988 | Guha et al. |
| 4,798,660 A | 1/1989 | Emer et al. |
| 4,816,082 A | 3/1989 | Guha et al. |
| 4,914,042 A | 4/1990 | Mahan |
| 4,915,745 A | 4/1990 | Pollock et al. |
| 4,950,615 A | 8/1990 | Basol et al. |
| 4,996,108 A | 2/1991 | Divigalpitiya et al. |
| 5,008,062 A | 4/1991 | Anderson et al. |
| 5,028,274 A | 7/1991 | Basol et al. |
| 5,029,760 A | 7/1991 | Gamblin |
| 5,039,353 A | 8/1991 | Schmitt |
| 5,045,409 A | 9/1991 | Eberspacher et al. |
| 5,069,868 A | 12/1991 | Tokiai et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,180,686 A | 1/1993 | Banerjee et al. |
| 5,211,824 A | 5/1993 | Knapp |
| 5,231,047 A | 7/1993 | Oyshinsky et al. |
| 5,248,345 A | 9/1993 | Sichanugrist et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,474,939 A | 12/1995 | Pollock et al. |
| 5,501,744 A | 3/1996 | Albright et al. |
| 5,512,107 A | 4/1996 | Van den Berg |
| 5,536,333 A | 7/1996 | Foote et al. |
| 5,665,175 A | 9/1997 | Safir |
| 5,977,476 A | 11/1999 | Guha et al. |
| 6,166,319 A | 12/2000 | Matsuyama |
| 6,288,415 B1 | 9/2001 | Leong et al. |
| 6,294,274 B1 | 9/2001 | Kawazoe |
| 6,328,871 B1 | 12/2001 | Ding et al. |
| 6,784,492 B1 | 8/2004 | Morishita et al. |
| 6,852,920 B2 | 2/2005 | Sager et al. |
| 6,878,871 B2 | 4/2005 | Scher et al. |
| 7,180,101 B2 | 2/2007 | Ouichi |
| 7,265,037 B2 | 9/2007 | Lee |
| 2002/0063065 A1 | 5/2002 | Sonoda |
| 2003/0075717 A1 | 4/2003 | Kondo et al. |
| 2004/0063320 A1 | 4/2004 | Hollars |
| 2004/0095658 A1 | 5/2004 | Buretea et al. |
| 2004/0110393 A1 | 6/2004 | Munzer et al. |
| 2004/0203220 A1 | 10/2004 | Morooka et al. |
| 2004/0244826 A1 | 12/2004 | Takagi |
| 2004/0245912 A1 | 12/2004 | Thurk et al. |
| 2004/0252488 A1 | 12/2004 | Thurk |
| 2005/0164432 A1 | 7/2005 | Lieber et al. |
| 2005/0287717 A1 | 12/2005 | Heald et al. |
| 2006/0002838 A1 | 1/2006 | Oda |
| 2006/0003585 A1 | 1/2006 | Morooka |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0053969 A1 | 3/2006 | Harada |
| 2006/0220059 A1 | 10/2006 | Satoh et al. |
| 2007/0006914 A1 | 1/2007 | Lee |
| 2007/0089782 A1 | 4/2007 | Scheuten et al. |
| 2007/0151596 A1 | 7/2007 | Nasuno et al. |
| 2007/0169810 A1 | 7/2007 | Van Duern et al. |
| 2008/0041446 A1 | 2/2008 | Wu et al. |
| 2008/0092945 A1 | 4/2008 | Munteanu et al. |
| 2008/0092953 A1 | 4/2008 | Lee |

FOREIGN PATENT DOCUMENTS

| | | |
|---|---|---|
| DE | 3314197 A1 | 11/1983 |
| DE | 10104726 A1 | 8/2002 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2004/332043 | 11/2004 |
| JP | 2005/311292 | 11/2005 |
| WO | WO 2005011002 | 2/2005 |

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of ZnxCd1_xS Nanocomposites in Polymer Matrices and their Photophysical Properties, Langmuir 1998, 14, pp. 4342-4344.

International Search Report and Written Opinion of PCT Application No. PCT/US08/76908, date of mailing Dec. 1, 2008, 8 pages total.

International Search Report and Written Opinion of PCT Application No. PCT/US2008/078001, date of mailing Dec. 2, 2008, 7 pages total.

International Search Report and Written Opinion of PCT Application No. PCT/US08/78019, date of mailing Dec. 8, 2008, 9 pages total.

International Search Report and Written Opinion of PCT Application No. PCT/US08/77965, date of mailing Dec. 9, 2008, 8 pages total.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Yang et al., Fabrication and Characteristics of ZnS Nanocrystals/Polymer Composite Doped with Tetraphenylbenzidine Single Layer Structure Light-emitting Diode, Applied Physics Lett. vol. 69 (3), Jul. 15, 1996, pp. 377-379.

Yang et al., Preparation, Characterization and Electroluminescence of ZnS Nanocrystals in a Polymer Matrix, J. Mater. Chem., 1997, 7(1), pp. 131-133.

Yang et al., Electroluminescence from ZnS/CdS Nanocrystals/Polymer Composite, Synthetic Metals 91, (1997) 347-349.

LASER SEPARATION METHOD FOR MANUFACTURE OF UNIT CELLS FOR THIN FILM PHOTOVOLTAIC MATERIALS

CROSS-REFERENCES TO RELATED APPLICATIONS

This application claims priority to and benefit from U.S. Provisional Patent Application No. 61/033,406, filed Mar. 3, 2008 and commonly assigned, the disclosure of which is hereby incorporated herein by reference for all purposes.

BACKGROUND OF THE INVENTION

The present invention relates generally to photovoltaic materials. More particularly, the present invention provides a method and system for manufacture of a solar module using a laser separation process for forming one or more unit cells from continuous layered structure of photovoltaic materials. Merely by way of example, the present method and structure have been implemented to a thin film solar module having single or multi junction photovoltaic materials, but it would be recognized that the invention may have other configurations.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles Calif. Other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. There have been attempts to form heterojunction cells using a stacked configuration. Although somewhat successful, it is often difficult to match currents between upper and lower solar cells. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

The present invention relates generally to photovoltaic materials. More particularly, the present invention provides a method and system for manufacture of a solar module using a laser separation process for forming one or more unit cells from continuous layered structure of photovoltaic materials. Merely by way of example, the present method and structure have been implemented to a thin film solar module having single or multi junction photovoltaic materials, but it would be recognized that the invention may have other configurations.

In a specific embodiment, the present invention provides a method for manufacture of unit cells for thin film photovoltaic device. The method includes providing an optically transparent substrate having a thickness, a back surface region, and a front surface region including one or more grid-line regions. The method further includes forming a layered structure including one or more films of photovoltaic materials overlying a metal layer. The metal layer overlies the front surface region. The method also includes transferring the optically transparent substrate having the layered structure. Additionally, the method includes aligning a laser beam from the back surface region through the thickness of the optically transparent substrate to illuminate a first region within the one or more grid-line regions. The method further includes subjecting a portion of the metal layer overlying the first region in the laser beam to separate a first portion of the layered structure from the first region. Moreover, the method includes scanning the laser beam from the first region to a second region along the one or more grid-line regions to cause formation of one or more unit cells of the layered structure and providing the one or more unit cells.

In certain embodiments, the laser beam used is a high power density pulse laser with a flat top beam intensity profile. The subjecting a portion of the metal layer overlying the first region induces a sublimation of the metal layer immediate above the first region. The sublimation is caused by converting the absorbed laser energy by the metal into latent heat of sublimation of the metal layer under the laser beam illumination. Subsequently, the rapid volume expansion of the sublimated metal causes a separation of a portion of the layered structure directly over the first region from the front surface region, which exposes a portion of the grid-line regions within the front surface region and forms a cross-sectional region of the remaining portion of the layered structure. In another embodiment, scanning process removes a plurality of portions of the layered structure by the laser beam and connects the plurality of portions to form one or more channels that divide the continuous layered structure into one or more unit cells.

In an alternative embodiment, the present invention provides a method for manufacture of unit cells for thin film device. The method includes providing an optically transparent substrate having a thickness, a back surface region, and a front surface region. The method further includes forming a layered structure characterized by one or more films of device materials sandwiched by a first conductive layer and a second conductive layer. The first conductive layer immediately overlies the front surface region. The method also includes transferring the optically transparent substrate having the layered structure. Additionally, the method includes providing an optical opaque sheet material including one or more grid-line openings with a first width, the optical opaque sheet material being disposed to immediate proximity of the back surface region so that the one or more grid-line openings are vertically projected to the front surface region to define one or more cell-boundary regions with the first width. The method further includes illuminating a light beam substantially vertically onto a first region within the one or more grid-line openings to allow at least partially the light beam to reach at a first portion within the defined one or more cell-boundary regions. Moreover, the method includes subjecting at least a portion of the first conductive layer overlying the first portion in the light beam to remove a column of the layered structure directly above the first portion. The method further includes scanning the light beam from the first region to a second region along the one or more grid-line openings to form one more channels by selectively removing a second width of the layered structure from the first portion to a second portion along the one or more cell-boundary regions. The second width is substantially the same as the first width. Furthermore, the method includes forming one or more unit cells of the layered structure divided by the one or more channels connected within the one or more cell boundary regions and providing the one or more unit cells.

Depending upon the specific embodiment, one or more of these features may also be included. The present technique provides an easy to use process that relies upon conventional technology that is nanotechnology based. In some embodiments, the method may provide a thin film based solar module with higher efficiencies in converting sunlight into electrical power using a multiple junction design and method. Depending upon the embodiment, the efficiency can be about 10 percent or 20 percent or greater. Additionally, the method provides a process that is compatible with conventional process technology without substantial modifications to conventional equipment and processes. For example, a pulse laser systems with a homogenous top-hat beam profiles are readily available commercially and laser beam scanning operation can be easily controlled and automated. Depending on the film material that to be removed selectively, the laser characteristics including the wavelength, power level, pulse length and duration etc. can be adjusted accordingly. In a specific embodiment, the present method and system can also be provided using large scale and environmentally friendly manufacturing techniques, which eliminate the usage of solvent for cleaning the side surface and reduce running costs associated with the manufacture of the photovoltaic devices. In particular, the side surface the thin film photovoltaic devices exposed after laser separation process is completely cleaned without any shorting between layers of the thin film. In another specific embodiment, the present method and structure can also be provided using any combination of suitable single junction solar cell designs to form top and lower cells, although there can be more than two stacked cells depending upon the embodiment. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention relates generally to photovoltaic materials. More particularly, the present invention provides a method and system for manufacture of a solar module using a laser separation process for forming one or more unit cells from continuous layered structure of photovoltaic materials. Merely by way of example, the present method and structure have been implemented to a thin film solar module having single or multi junction photovoltaic materials, but it would be recognized that the invention may have other configurations.

Figure 1:
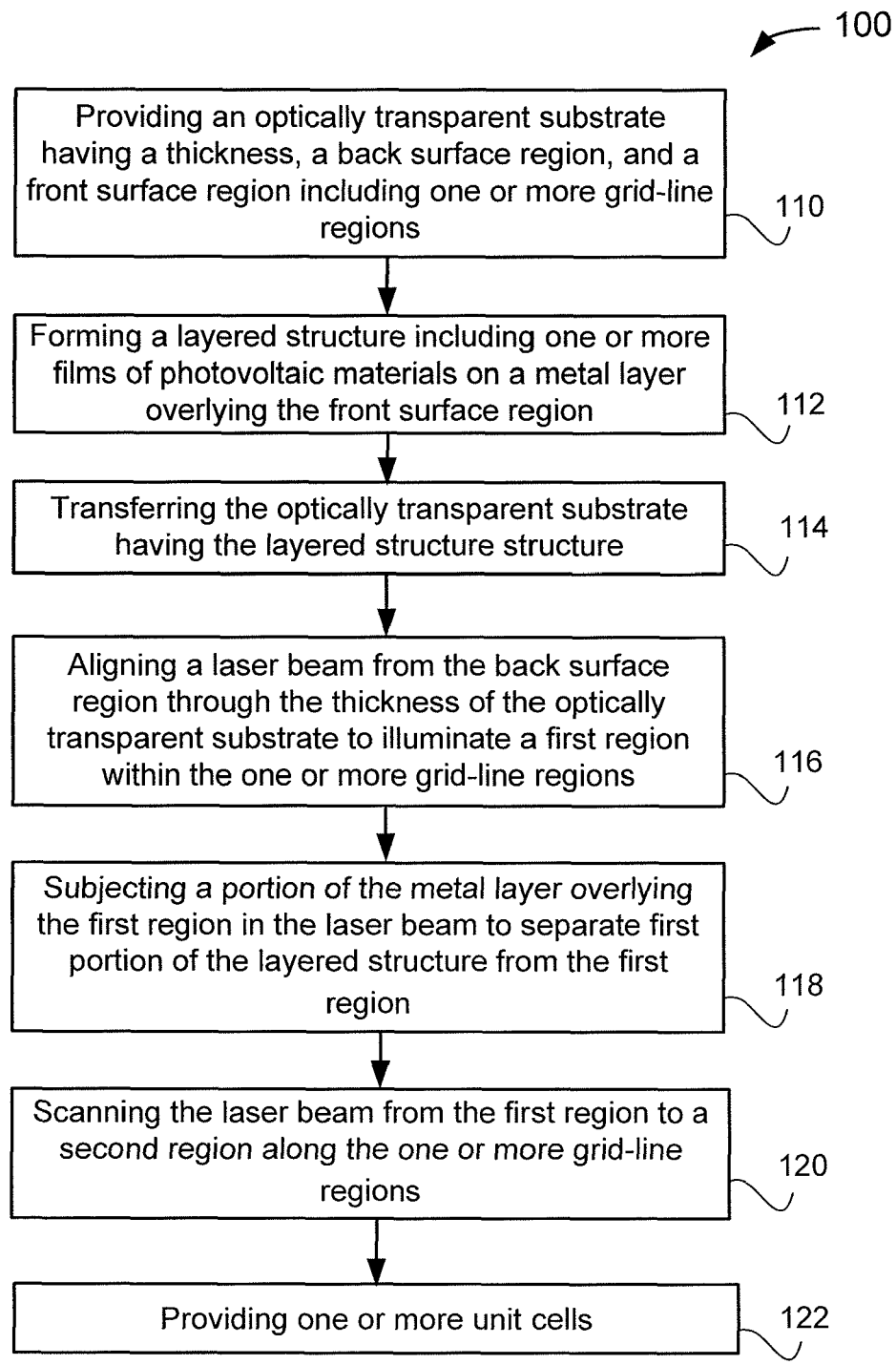
FIG. 1 is a simplified flowchart illustrating a method for forming unit cells for manufacture of a solar module using laser separation according to an embodiment of the present invention.

FIG. 1 is a simplified flowchart illustrating a method for forming one or more unit cells for manufacture of a solar module using laser separation according to an embodiment of the present invention. This diagram is merely an example, which should not unduly limit the scope of the claims herein. The method 100 includes the following processes:

1. Process 110 for providing an optical transparent substrate having a back surface region and a front surface region including one or more grid-line regions with a width;

2. Process 112 for forming a layered structure including one or more films of photovoltaic materials overlying a metal layer which overlies the front surface region;

3. Process 114 for transferring the optically transparent substrate having the layered structure;

4. Process 116 for aligning a laser beam from the back surface region through the thickness of the optically transparent substrate to irradiate a first region within the one or more grid-line regions;

5. Process 118 for subjecting a portion of the metal layer overlying the first region in the laser beam to separate a portion of the layered structure from the first region;

6. Process 120 for scanning the laser beam from the first region to a second region along the one or more grid-line regions; and 7. Process 122 for providing one or more unit cells.

The above sequence of processes provides a method for fabricating a solar module using a laser separation process for forming one or more unit cells from the continuous sandwiched structure of photovoltaic materials overlying an optically transparent substrate according to an embodiment of the present invention. Other alternatives can also be provided where processes are added, one or more processes are removed, or one or more processes are provided in a different sequence without departing from the scope of the claims herein. Further details of the method can be found throughout the present specification and more particularly below.

Figure 2:
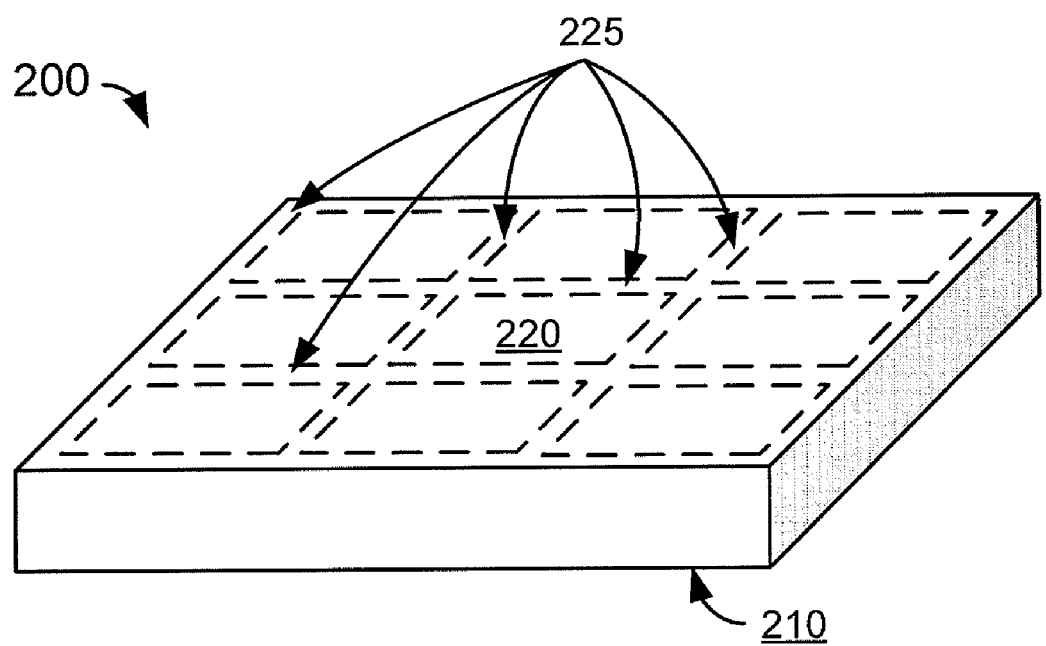
FIG. 2 is a simplified diagram illustrating a substrate provided for fabricating a solar module according to an embodiment of the present invention.

At Process 110, an optically transparent substrate is provided. This process can be visually illustrated by FIG. 2. FIG. 2 is a simplified diagram illustrating a substrate provided for fabricating a solar module according to an embodiment of the present invention. This diagram is merely an example, which should not unduly limit the scope of the claims herein. One of ordinary skill in the art would recognize many variations, alternatives, and modifications. As shown as a prospective view, the optically transparent substrate 200 includes a thickness, a back surface region 210 (not directly viewable), and a front surface region 220 (directly viewable). The front surface region 220 may be virtually divided into multiple fields by a plurality of grid-line regions 225 including a periphery edge region. In certain embodiments, the substrate can serves as an upstrate. Hereby the meaning of "front" or "back" is just intended for distinguish the two surfaces while not limited to specific orientation. The grid-line regions 225 are not required to be physically marked on the front surface region. In one embodiment, the specific dimensions of the grid-line regions including a width and one or more line-to-line spacing are predetermined depending on the applications. For example, the width for the grid-line regions can be ranged from about 1 mm to 20 mm or greater, intending to divide cells by a predetermined cell-to-cell spacing. The line-to-line spacing defines the size of unit cells to be formed. In one embodiment, the substrate 200 is made of material that is optically transparent. For example, the substrate 200 can be a glass substrate, or a acrylic substrate, or a quartz substrate, or a fused silica substrate. In particular, the substrate material is at least transparent to lights with wavelengths ranging from about 400 nm to about 1200 nm. Of course, there can be other variations, alternatives, and modifications.

At Process 112, a layered structure including one or more films of photovoltaic materials overlying a metal layer is formed spanning spatially overlying the front surface region.

In certain embodiment, the one or more films of photovoltaic materials can be made using thin film metallic oxide bearing semiconductor characteristic. In other embodiments, the one or more films of photovoltaic materials can be a thin amorphous silicon film, a poly-crystalline film, a compound semiconductor film, or a thin film with nano-structured materials. The metal layer may act as an electrode layer for a final photovoltaic cell. In certain embodiment, the metal layer may be replaced by a transparent conductive oxide layer. More detailed description of forming the continuous sandwiched structure including one or more films of photovoltaic materials can be found in a commonly assigned United Stated Patent Application No. 60/988,099 titled "THIN FILM METAL OXIDE BEARING SEMICONDUCTOR MATERIAL FOR MULTI-JUNCTION SOLAR CELL DEVICES" by Howard W. H. Lee filed at Nov. 14, 2007. Of course, there can be other variations, alternatives, and modifications in the selection of the photovoltaic materials.

Figure 3:
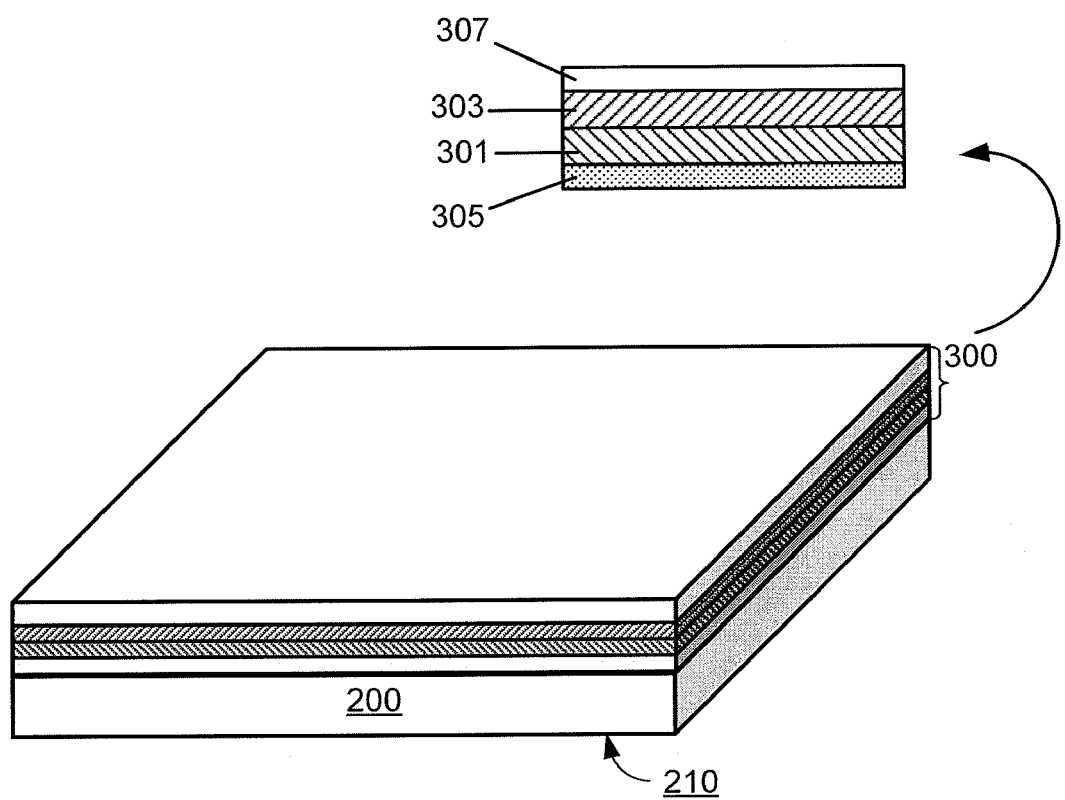
FIG. 3 is a simplified diagram schematically showing a layered structure including films of photovoltaic materials formed on the substrate according to an embodiment of the present invention.

As an illustration, FIG. 3 is a simplified diagram schematically showing a continuous layered structure including one or more films of photovoltaic materials formed overlying a metal layer which overlies the surface region of a substrate according to an embodiment of the present invention. This diagram is merely an example, which should not unduly limit the scope of the claims herein. One of ordinary skill in the art would recognize many variations, alternatives, and modifications. As shown, the layered structure 300 is formed overlying the front surface region 220 (now being covered) of the provided substrate 200. A inset side view schematically shows a plurality of layers within the layered structure including at least a conductive layer 305 overlying front surface region 220, a P-type semiconductor layer 301 overlying layer 305, a N-type semiconductor layer 303 overlying P-type semiconductor layer 301, and a conductive layer 307 overlying the N-type semiconductor layer 303. In one embodiment, P-type semiconductor layer 301 can be a P-type impurity doped material made of silicon, or germanium, or III-V group semiconductor, or copper indium diselenide (CIS), or Copper Indium Gallium Selenide (CIGS), or Cadmium Telluride (CdTe), or metal oxide bearing semiconductor material, or nanostructure material. Overlying the layer 301, the N-type semiconductor layer 303 can be a N-type impurity doped material made of silicon, or germanium, or III-V group semiconductor, or copper indium diselenide (CIS), or Copper Indium Gallium Selenide (CIGS), or Cadmium Telluride (CdTe), or metal oxide bearing semiconductor material, or nanostructure material. In another embodiment, the conductive layer 305 and 307 each serves as an electrode layer to one or more photovoltaic cells to be fabricated. In one embodiment, the layer 305 overlying surface region 220 of a substrate can be made of a metal. In another embodiment, the layer 305 overlying a surface region of an upstate can be a transparent conductive oxide. Correspondingly, the layer 307 can be made of a transparent metal oxide. Of course, these are exemplary illustrations which should not unduly limit the scope of the claims herein. One of skilled in the art should be able to recognize many variations, alternatives, and modifications of the sandwiched structure of thin film or thick film photovoltaic materials for solar module.

At Process 114, the method includes transferring the optically transparent substrate having the layered structure according to an embodiment of the invention. After forming the layered structure 300 on the front surface region 220 of the substrate 200, the whole piece of substrate including the layered structure is transferred from a film-formation processing station to a processing stage (not directly shown) of a laser separation. The substrate having the layered structure spanning on the front surface region can be as large as meter-by-meter in scale. A robot system that is configured to support the back surface regions can be used for the transferring operation. The stage for holding the substrate in the laser separation processing station is configured to support one or more regions on the back surface region 210 which directly oppose to the corresponding field regions of the front surface region 220 but leave all areas opposing to the plurality of grid-line regions 225 exposed.

At Process 116, the method 100 includes aligning a laser beam from the back surface region through the thickness of the optically transparent substrate to illuminate a first region within the one or more grid-line regions. In an specific embodiment, the laser beam is introduced from the back surface region of the optically transparent substrate to facilitate removal a portion of the layered structure from the front surface region without any physical blocking. In one embodiment, the laser beam is aligned in a direction substantially vertical to the back surface region. The alignment allows a beam spot to be placed within an exposed area on the back surface region opposing to the first region on the front surface region. Further, the laser beam is configured to scan across the substrate following a predetermined pattern or can be configured to tilt to an arbitrary angle relative to the back surface region depending on applications. Of course, the alignment of the laser beam from the back surface region determines the relative position on the front surface region being irradiated by the beam spot.

Figure 4:
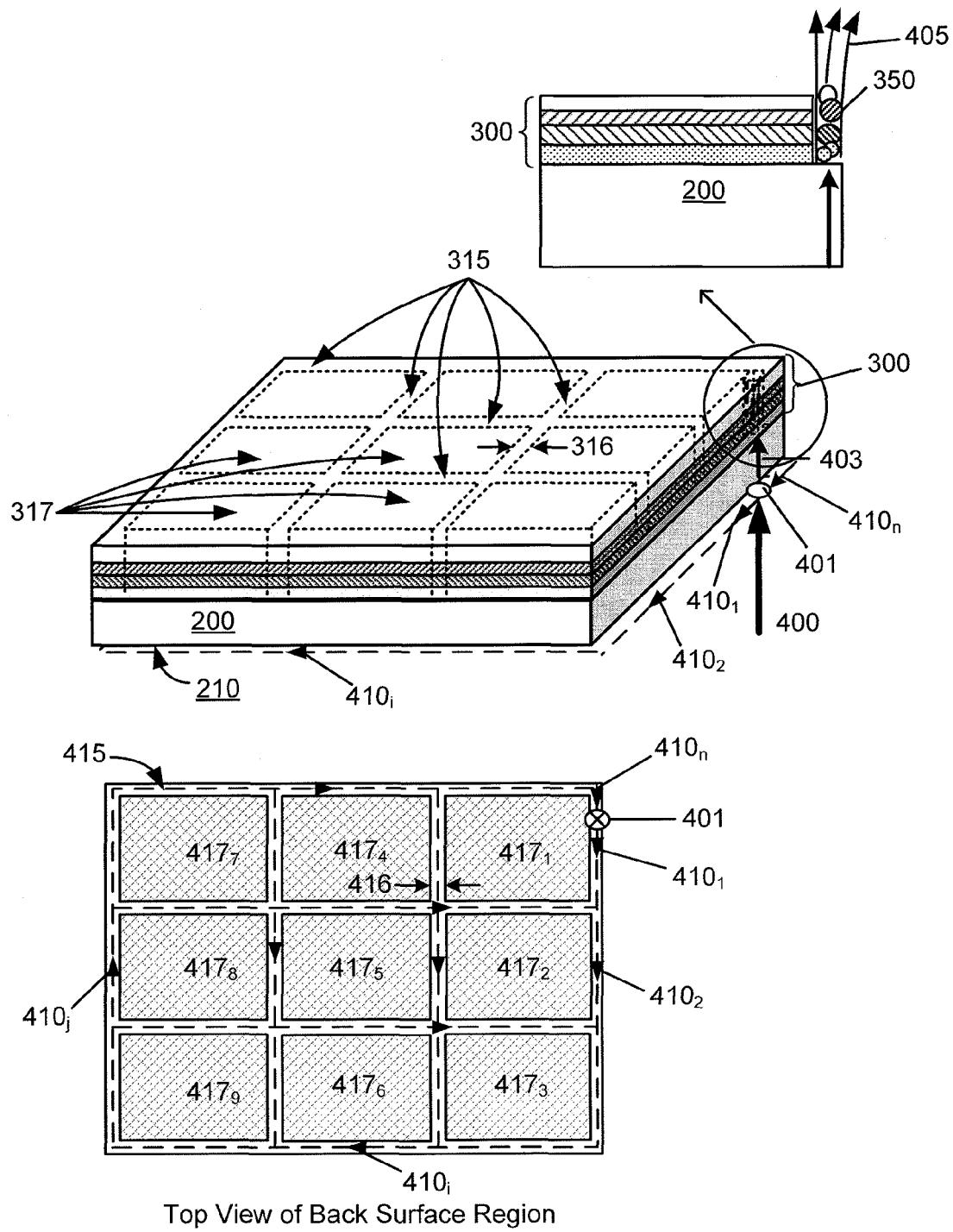
FIG. 4 is a simplified diagram illustrating a snap shot of a laser beam being aligned to irradiate at an exposed area of back surface region during a laser separation process according to an embodiment of the present invention.

FIG. 4 is a simplified diagram illustrating a snap shot of a laser beam being aligned to illuminate at an exposed area of back surface region during a laser separation process according to an embodiment of the present invention. This diagram is merely an example, which should not unduly limit the scope of the claims herein. One of ordinary skill in the art would recognize many variations, alternatives, and modifications. As shown, laser beam 400 is aligned to irradiate at a spot 401 on the back surface region 210 of the optically transparent substrate 200 in a direction substantially perpendicular to the back surface region. In one embodiment, the laser beam can be generated from a high power density YAG laser source. For example, a Nd:YAG pulsed laser source is used. In another example, a pulsed fiber laser is used. In particular, the laser source is a mode-locked, Q-switched Nd:YAG laser source with a pulse length varying from nanoseconds to miliseconds and a tunable pulse duration from microseconds to milliseconds. The output wavelengths, for example, for the Nd:YAG pulsed laser source can be in a range of 500 nm to 1200 nm. In a specific embodiment, the laser beam is selected to have a homogenous top-hat beam intensity profile so that the laser flux under the beam spot is substantially uniform for ablating the material with a desired edge sharpness. For example, the laser energy density of about 50 W/cm$^2$ may be substantially uniform for nearly full beam spot size of about 3 mm or bigger with a top-hat beam profile. In addition, a 50 W/cm$^2$ power density can be high enough, after penetrating through the substrate, to be absorbed by an immediate first layer of material to induce a laser separation process. In general, the laser separation process according to the present invention is tuned to selectively remove a portion of thin film materials formed on the front surface region by directing the beam directly from the back surface region. Of course, there can be other variations, alternatives, and modifications.

Referring to FIG. 4 again, a top view of back surface region 210 is also schematically given. As shown, a plurality of optically opaque areas labeled 417$_1$ through 417$_9$ may be covered by a non-transparent or optical opaque sheet material. In one embodiment, the optically opaque areas 417$_1$ through 417$_9$ occupy majority portion of the back surface region 210. At the same time, those exposed area 415 including a peripheral edge region as well as the strips and columns that separates the optical opaque areas 417$_1$ through 417$_9$. In one embodiment, the opaque areas is provided to ensure the laser beam 400 not to pass through while the exposed area 415 is intentionally laid out to project correspondingly to the one or more grid-line regions 225 defined on the front surface region 220. In one embodiment, the laser beam 400 has a beam spot size bigger or smaller than the predetermined width 416 of the exposed area 415. Therefore, the exposed area 415 allows the laser beam 400 at least partially to pass through the substrate and reach the one or more predetermined grid-line regions 225. As shown in FIG. 4, the laser beam 400 irradiated at the spot 401 turns into a beam 403 along a path within the optically transparent substrate. The beam 403, bearing substantially the same power as the beam 400, reaches a first region 305 of the front surface region directly opposed to the spot 401. The first region 305 is within the grid-line regions 225 of the front surface region 220.

At Process 118 the method includes subjecting a portion of the metal layer overlying the first region in the laser beam to separate a portion of the layered structure from the first region. In one embodiment, the metal layer is an immediate first layer subjecting to the irradiation of the laser beam which has a wavelength adapted to be strongly absorbed by the metal layer depending on particular material. Therefore, once the portion of the metal layer is under irradiation of the laser beam 403, the energy of high power laser would be mostly converted into heat into local portion of the metal layer. Because of using the high power pulsed laser beam, the energy density becomes exceptionally high, for example as high as 50 W/cm$^2$, within a short time at least partially the heat can be transferred to a latent heat of sublimation of the portion of the metal layer without any melting. Therefore, a portion of metal layer is directly transformed from solid state into vapor. In another embodiment, the pulse length, wavelength, and the power level of the laser may be tuned to produce the desired sublimation result depending on specific material composition of the metal layer.

Additionally, at the Process 118, the sublimation of a portion of metal layer induces a rapid volume expansion around the interface vicinity of the first region under the laser beam illumination. Depending on the pulse length of the high power laser beam, in a specific embodiment, the volume expansion possess an momentum from the aligned laser beam and tends to gain its space from the neighboring material with the weakest structure strength directly above the sublimated portion of metal layer. With assistance of the pulsed laser beam, the rapid expansion of the sublimated metal layer creates a strong mechanical force within very short amount of time and can effectively break apart the material bonding of the portion of the layered structure, blowing out the portion of the layered structure directly overlying the sublimated portion of metal layer. In one embodiment, the portion of the layered structure directly overlying the sublimated portion of metal layer is completely free from the first region of the front surface region.

Referring again to the inset of FIG. 4, as the aligned laser beam 403 passes through the optically transparent substrate 200, a portion of metal layer under the spot is sublimed which rapidly expands to break apart the portion of the layered structure 305 directly above by the strong momentum 405 induced by the high power pulse laser. Additionally, because the laser pulse length can be adjusted to as short as nanoseconds range, the material removal process is highly selective and confined by the laser beam spot. In particular, as the laser beam intensity profile is chosen to have a homogeneous top-hat shape, the beam intensity is substantially uniform across the beam spot so that the resulted material removal for every spot-illumination also shows sharp edges. In other words, the lateral dimension of the portion of layered structure being removed by above laser separation process can be controlled with high precision to form a straight cutoff shape of a cross-sectional region around the edge of the beam spot. The edge direction can be substantially in parallel to the direction of the aligned laser beam. In another embodiment, the material removal process by the laser beam does not necessarily cause sublimation of all layers of material of the layered structure. Instead, the major portion of the layered structure is mostly broken into small particle or dust and blown away by the strong mechanical force generated during the rapid volume expansion of a small portion of metal layer. These particles or dusts can be easily sucked up by a vacuum head pre-disposed nearby, leaving behind the cleaned first region and cross-sectional regions. In yet another embodiment, with properly optimized laser separation process and configuration of the vacuum head (not shown in FIG. 4), the cross-section region formed in the above controlled laser separation process is found substantially free of any residues of the removed portion of the layered structure.

Additionally the method 100 includes a process of scanning the laser beam from the first region to a second region along the one or more grid-line regions (Process 120). In one embodiment, the laser beam 400 is generated by a laser source (not shown) including one or more mirrors configured to redirect the beam from a first spot to a second spot along various paths of the exposed areas 415. In another embodiment, the laser beam 400 itself can be fixed in position while the substrate 200 supported by a sample stage can be operably moved to allow the laser beam 400 scanning relatively from the first spot to a second spot along various pathways of the exposed area 415. As shown in FIG. 4, the dashed line represents the laser beam scanning path and a plurality of arrows $410_1$, $410_2$, $410_i$, $410_j$, and $410_n$ each represents an instant beam spot during the scanning procedure. For example, the laser beam 400 is scanned from a first spot location $410_1$ to a second spot location $410_2$, and so on. In a specific embodiment, the scanning procedure includes moving a plurality of isolated beam spots step by step. Each of the plurality of isolated beam spots is overlapped by about 10-15% with a immediate next of the plurality of isolated beam spots. At each step, the beam spot is under illumination within a time of a predetermined pulse length of the laser. Then it shifts to the next step within a time of a pulse duration of the laser followed by another illumination at the next step. The laser scanning rate is one of process parameter and can be synchronized with the pulse laser characteristics. It can be predetermined and adjustable depending on the specific material composition of the layered structure to be removed.

At every spot along with any scanning path, the laser beam 400 passes from the back surface region through the thickness of the substrate 200. For example, the laser beam 400 passes from a first spot on the back surface region into the media of the transparent substrate 200 and turns to a beam 403 reaching a first region of the front surface region from inner side. Further it is scanned from a first region to a second region along the one or more grid-line regions 225. In other words, the first region and the second region irradiated by the beam 403 are respectively opposed to the first spot and the second spot of the beam 400. As the Process 120 is in progress the film materials of the portion of the layered structure illuminated by the beam 403 are selectively removed by the laser beam using Process 118 and 120. In one example, the laser beam 400 is scanned a whole loop of the exposed edge area 415 from the first spot location $410_1$, through $410_2$ to $410_n$ and finally returned the starting location $410_1$. In such a process, the whole peripheral edge portion of the layered structure 300 are selectively removed. Of course, there can be many variations, alternatives, and modifications.

In another process, the laser beam is scanned along the predetermined one or more grid-line regions 225, which can be defined by projecting the grid-line openings of the optical opaque sheet material disposed at the immediate proximity on the back surface region, across the whole layered structure 300 on the substrate 200 to remove a width of film materials. As a result, FIG. 4 also schematically illustrates that multiple channels 315 with a width 316 in a row/column grid-line pattern are formed within the layered structure 300 to separate the layered structure into multiple units 317. In a specific embodiment, the width 316 of these channels is determined by the beam spot and beam profile as well as the scanning routing. For example, the width 316 of those channels can be substantially equal to the predetermined width of the one or more grid-line regions on the front surface region 220 which is indirectly defined by a vertical projection from the width 416 of the grid-line openings associated with the back surface region 210. The remaining portion of the layered structure 300 are still composed by one or more films of photovoltaic materials overlying the remaining portion of the metal layer and are now divided by the channels 315. As shown, each unit 317 located on a portion of front surface region 220 opposes to a corresponding portion of the optically opaque sheet material 417 associated with the back surface region 210 of the substrate 200.

Figure 5:
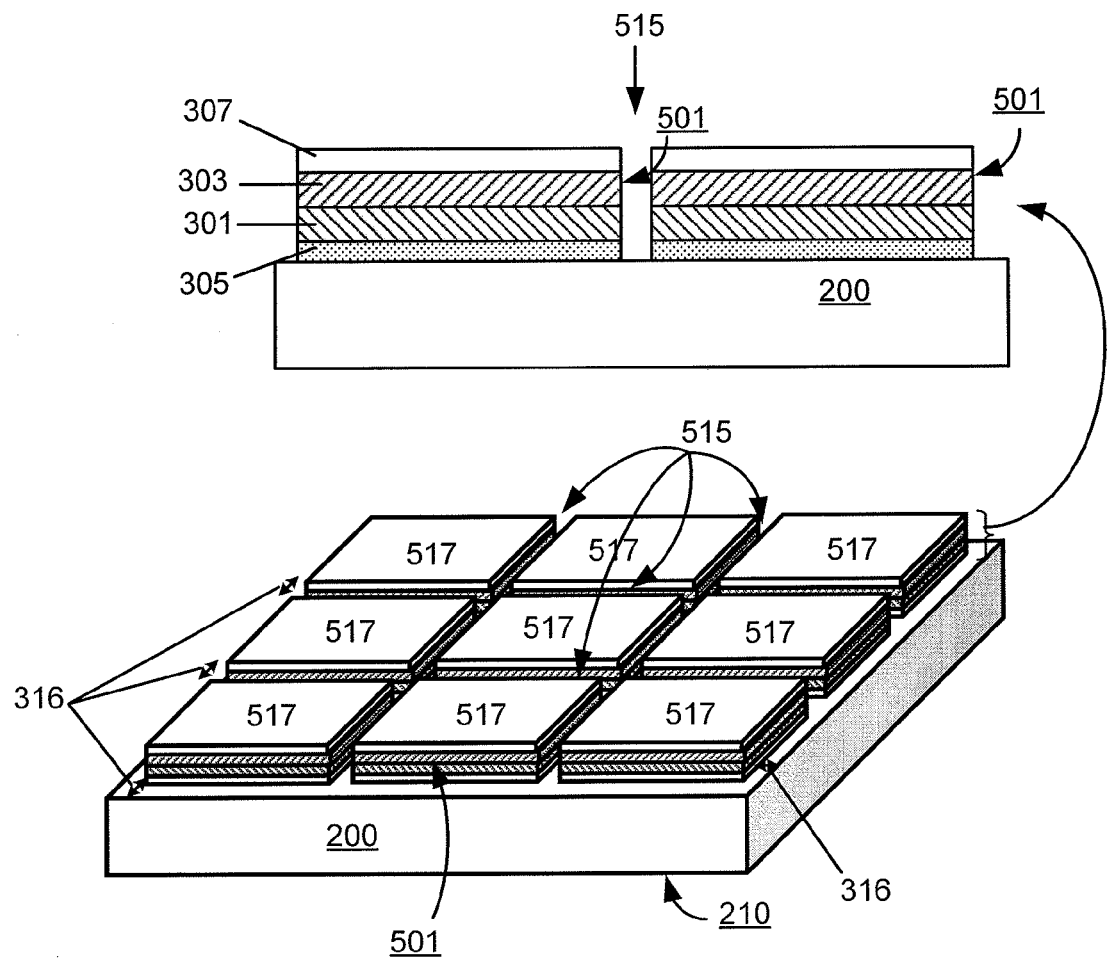
FIG. 5 shows a simplified diagram illustrating multiple unit cells formed from the layered structure by a laser separation process according to an embodiment of the present invention.

FIG. 5 shows a simplified diagram illustrating multiple unit cells formed from the layered structure by a laser separation process according to an embodiment of the present invention. This diagram is merely an example, which should not unduly limit the scope of the claims herein. One of ordinary skill in the art would recognize many variations, alternatives, and modifications. As shown, the laser separation process mentioned in last paragraph has removed a width of the layered structure within the portion 315, which becomes one or more channels or trenches 515 cutting the layered structure down to the front surface region 220. Naturally, these one or more channels 515 act as boundary regions of one or more unit cells 517 of the layered structure. A side view also shows in more detail of the unit cell structure after the laser separation process is performed on both edge region and inner grid-line region. In a specific embodiment, each channel exposes a portion of the front surface region 220 and is sided with one or more cross-sectional region 501. The cross-sectional region 501 exposes every layers of the layered structure including the one or more films of the photovoltaic materials sandwiched by a metal layer beneath and another conductive layer on top. For example, as shown in the side view of FIG. 5, the cross-sectional region 501 reveals the metal layer 305, a P-type semiconductor layer 301, an N-type semiconductor layer 303, and a transparent conductive oxide layer 307. In certain embodiments, the laser separation process is capable to provide the exposed portion of the front surface region 220 substantially free of residues of removed film materials during the laser separation process. Additionally, the laser separation process is capable to provide the cross-sectional region 501 substantially free of residues of removed film materials which otherwise may cause conductive shorting between the layers resulting failure or damage to the solar device. In other words, the one or more unit cells 517 possesses all device functionalities after laser separation from the continuous layered structure.

At Process 122, the method 100 includes providing one or more unit cells for manufacture of solar module. Essentially, the multiple unit cells 517 formed in a laser separation process to cut the layered structure 300. Additionally, the laser separation process (processes 118 and 120), including any associated vacuum cleaning process, remove any residue of film materials from the cross-section region to prevent from any shorting between the layers. The layered structure includes one or more P-N junctions among the one or more films of photovoltaic materials and includes at least one electrode layer made by a metal layer and another electrode layer made by a transparent conductive oxide layer. All the layers exposed at the cross-section region are substantially free of layer-shorting residue particles. Therefore, each unit cell 517 produced by the method 100 retains all the layered structures and by itself is capable of forming one unit photovoltaic cell of a solar module.

Depending on the applications, Process 122 for providing one or more unit cells for manufacture of solar module may include transferring one or more unit cells out of the layered structure from the substrate. For example, the transferred unit cell can be packaged into or integrated with other devices or products to form a solar powered device or product. In another example, the thin film photovoltaic unit cell can be implemented to a building material surface which can be used to build high energy efficient buildings from sky scraper to single family home. Since the laser separation process completely reveals the electrode layers (for example layer 305 or layer 307) in the cross-section region 501 and cleans the cross-section region substantially free of layer-shorting residues of removed film materials, one or more electric connectors can be selectively inserted within the one or more channels or trenches 515 to couple to the one or more electrode layers. In another embodiment, Process 122 may also include coupling one unit cell with another electrically in series or in parallel to manufacture flexible solar module for different applications.

Figure 6:
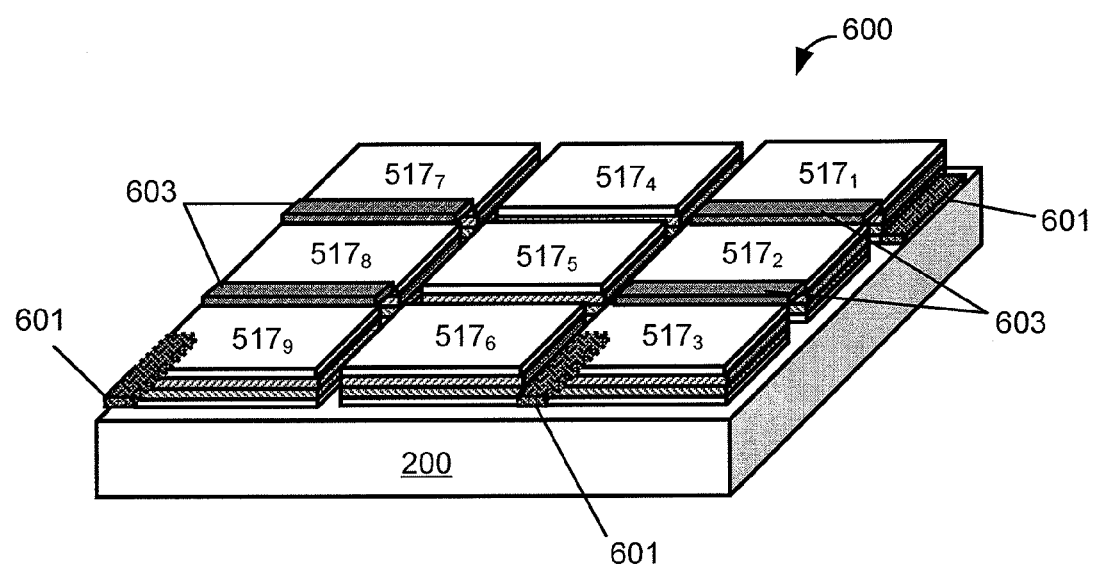
FIG. 6 shows an exemplary solar module including multiple unit cells cross linked with electric connectors according to an embodiment of the present invention.

For example, FIG. 6 shows an exemplary solar module including multiple unit cells cross linked with electric connectors according to an embodiment of the present invention. As shown, the solar module 600 includes multiple unit cells ($517_1$ through $517_9$) provided on a substrate 200. For example, each of the multiple unit cells $517_1$ through $517_9$ are made from the unit 517 formed in Process 118. The solar module includes an electric connector 601 for coupling an electrode layer of one unit cell $517_1$ on the upper right corner to either a neighboring unit cell within the solar module or another unit cell of a separate solar module. The whole right column of unit cells ($517_1$ through $517_3$), as shown, is coupled electrically in parallel by one or more connectors 603. Similarly, other columns of unit cells, $517_4$ through $517_6$ or $517_7$ through $517_9$, can also be coupled electrically in parallel by additional connector 603. While the column to column coupling can be in series by additional connectors 601. Of course, there can be many variations, alternatives, and modifications in the coupling order, configuration, and connector type for manufacture of the solar module using a plurality of thin film photovoltaic unit cells provided in Process 122.

Figure 7:
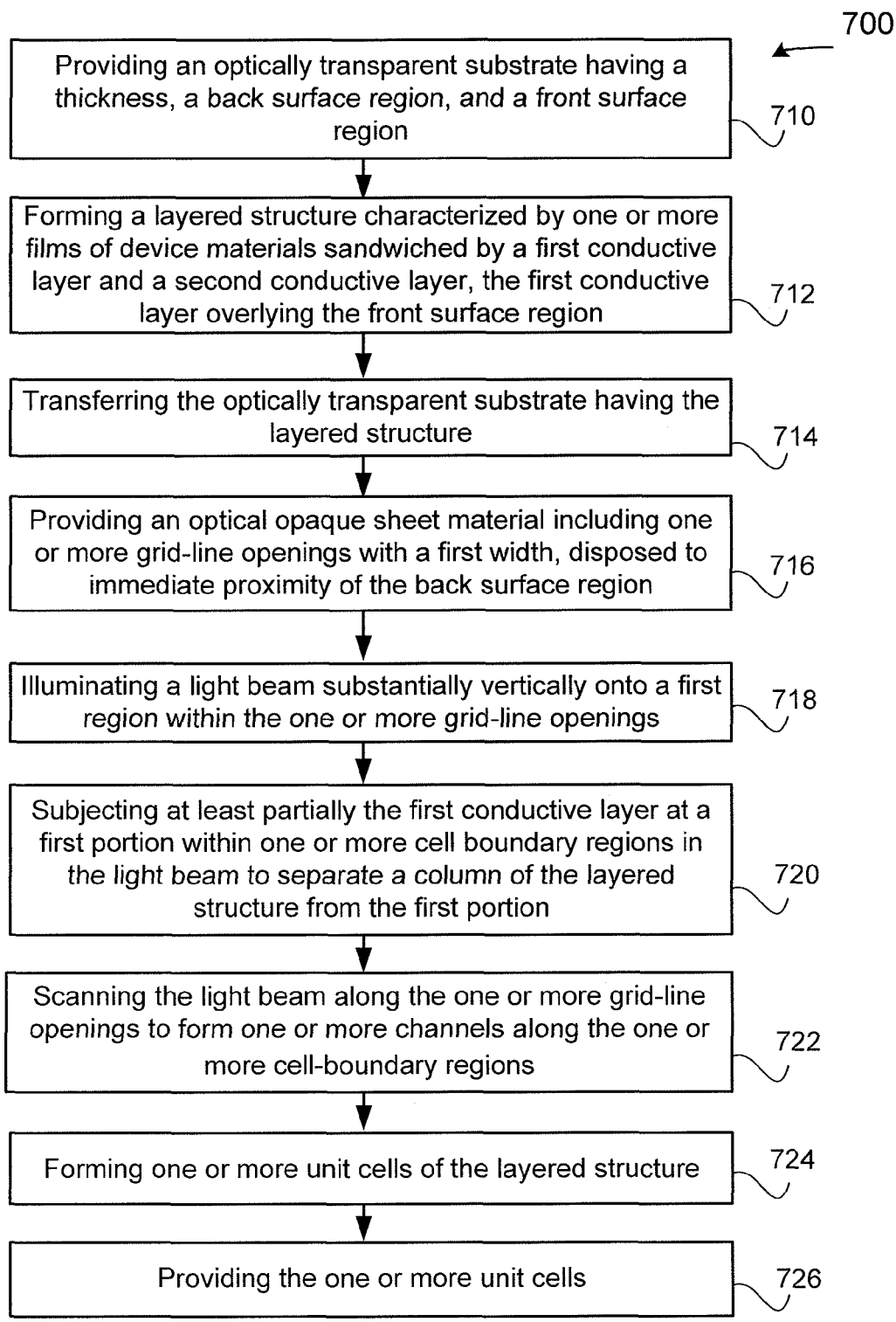
FIG. 7 is a simplified flowchart illustrating a method for manufacture of unit cells for thin film devices according to an alternative embodiment of the present invention.

FIG. 7 is a simplified flowchart illustrating a method for manufacture of unit cells for thin film devices according to an alternative embodiment of the present invention. This diagram is merely an example, which should not unduly limit the scope of the claims herein. The method 700 includes providing an optically transparent substrate having a thickness, a back surface region, and a front surface region (710). For example, the optically transparent substrate can be the substrate 200 shown in FIG. 2. In one case, the substrate used may be transparent to light with wavelength ranging from 400 nm to 1200 nm. For example, the optical transparent substrate can be made of glass, or acrylic, or quartz, or fused silica or similar materials.

Additionally, a layered structure including one or more films of device materials sandwiched by a first conductive layer and a second conductive layer is formed spanning spatially overlying the front surface region (712) of the substrate. The first conductive layer directly overlying the front surface region can be a metal layer. In one embodiment, the first conductive layer can also be transparent conductive oxide overlying the front surface region of an upstrate. This process can be substantially the same as the process 112 and the layered structure made by one or more films of photovoltaic materials can be substantially the same the layered structure 300 shown in FIG. 3.

The optically transparent substrate having the layered structure spatially overlying the front surface region is then transferred (714) depending on the applications. The method 700 further includes providing an optical opaque sheet material including one or more grid-line openings with a first width. The optical opaque sheet material is disposed to immediate proximity of the back surface region. In an embodiment, the optical opaque sheet material is intended to block at least a light that is transparent to the substrate. For example, the optical opaque sheet material does not allow at least light with wavelength within 500 nm to 1200 nm to pass through. The process 716 causes the one or more grid-line openings with a first width to be projected in a substantially vertical direction from the back surface region to the front surface region so that one or more cell-boundary regions can be defined with a width substantially the same as the first width. For example, the defined cell boundary regions can be the same as the grid-line regions 225 shown in FIG. 2. In another example, the first width is predetermined to be in a range from 1 mm to about 20 mm and more.

Additionally, the method 700 includes a process 718 for illuminating a light beam substantially vertically onto a first region within the one or more grid-line openings. In one embodiment, the light beam is a high powered laser beam generated from a mode-locked pulse laser source. The light beam is outputted from a laser source disposed near the back surface region and is aligned towards the first region within the one or more grid-line openings in a direction perpendicular to the back surface region. For example, the laser source can be a mode-locked Q-switched Nd:YAG laser source characterized by a wavelength ranging from 500 nm to 1200 nm, a pulse length ranging from nanoseconds to milliseconds, an energy density of about 50 W/cm$^2$, and a homogeneous top-hat intensity profile. Of course, there are many alternatives, variations, and modifications. The laser beam can have a beam spot size bigger than the first width of the grid-line openings within the optical opaque sheet material so that only partial beam may pass through the grid-line openings and further through the thickness of the transparent substrate. In another case, the beam spot size can be smaller than the designed width of the grid-line openings so that the beam needs to be scanned around to cover full width of the grid-line openings.

Referring to FIG. 7 again, the method 700 includes a process 720 for subjecting at least partially the first conductive layer at a first portion within one or more cell boundary regions in the light beam to separate a column of the layered structure from the first portion. The laser power, after passing through the transparent substrate and reaching the first region of the front surface region, can be absorbed by the first conductive layer immediately above the front surface region. At least a portion of the first conductive layer, usually a metal layer with a strong absorbance band associated with the wavelength of the laser, can be heated in a very short time of a pulse length by absorbing energy from the high power density pulse laser. The heat, at least partially is converted into latent heat of sublimation of the first conductive layer. Subsequently, the portion of the first conductive layer is sublimated or vaporized. The vaporized portion would rapidly expand its volume and, assisted by the aligned laser beam, generate a strong mechanical force to break bonding of materials within the layered structure. In one embodiment, a column of material of the layered structure within the first region directly above the sublimated portion of the first conductive layer is separated from the first region of the front surface region. In another embodiment, the column of material is broken apart into small pieces, particles, or dusts blown out of the continuous layered structure from the substrate, leaving behind a void column with a bottom and a surrounding side wall. The bottom is the exposed first region and the side wall is also an cross-sectional region of the remaining portion of the layered structure. In one embodiment, the laser separation process is capable of freeing a portion of layered structure from the front surface region leaving behind an exposed area of front surface region and one or more cross-sectional regions substantially free of residues from the freed materials. In yet another embodiment, a vacuum head can be placed over the second conductive layer to suck out the blown out dusts or any residue particles. Because the high-power laser has a top-hat beam intensity profile over the whole beam size, the mechanical force generated in the laser separation process is highly-directional in parallel to the aligned laser beam so that the size of the resulted void column is substantially equal to the first region illuminated by the laser beam spot.

Moreover, the method 700 includes a process (722) of scanning the light beam along the one or more grid-line openings to form one or more channels along the one or more cell-boundary regions. Scanning essentially performs repeating laser separation processes step by step. The scanning speed needs to be adjusted based on the characteristics of the selected laser beam as well as the optical properties of film materials to be removed. In particular, the laser beam intensity profile is a critical factor to determine how much overlapping fraction for each illumination spot should be relative to an immediate last illumination spot before the laser beam scans or shifts. The beam spot size also affects the scanning routines for achieving a desired width of channel or trench by connecting a plurality of removed portions of layered structure, each being a void column formed by each beam illumination spot. Usually, a 10-15% overlapping of the beam spot from step to step during the scanning is used. In one embodiment, the laser illumination and scanning routines can cover a full first width of the grid-line openings so that a channel or trench with a second width can be formed along the projected cell-boundary regions. The second width is substantially equal to the first width if the laser beam with top-hat beam profile is well aligned in the vertical direction to the back surface region. For example, one or more channels with a width ranging from about 1 mm to about 20 mm and more can be formed by the laser separation process. In one example, the one or more channels or trenches formed are substantially similar to the trenches 515 shown in FIG. 5. In one embodiment, the laser illumination and scanning also is performed along a full pattern of the grid-line openings to selectively remove a width of the layered structure to form all the channels along the whole cell-boundary regions.

In a specific embodiment, the scanning process is performed by controlling a mirror to guild the movement of the beam. In another embodiment, the scanning process can be performed by using a robot system to drive the stage that holds the substrate relative to a fixed laser beam. The stage movement allows the laser beam to irradiate at a first region within the grid-line openings and to move from the first region to a second region in a predetermined scanning procedure (with a planned pathway, spot coverage, and scanning speed). In a specific embodiment, the scanning process is operated to allow the beam to irradiate within grid-line openings from a first region to a second region. Depending on the specific film material property, provided grid pattern, and selection of the pulsed laser source, one can precisely control the dimension of ablated portion within the layered structure.

In one embodiment, the method 700 further includes a Process 724 for forming one or more unit cells of the layered structure. In a specific embodiment, the one or more channels formed within the continuous layered structure expose a portion of front surface region and also create one or more cross-sectional regions of the remaining portion of the layered structure as their side walls. In one embodiment, the exposed portion of the front surface regions maps with the cell-boundary regions defined in Process 716. In another embodiment, the cross-sectional regions retain all the films and layers of the layered structure formed in Process 712. In yet another embodiment, the cross-sectional region formed using the method 700 has a straight-edge shape substantially vertical to the substrate. The laser separation process can be tuned to form the one more channels with substantially free of residue particles therein. In one embodiment, a vacuum head can be applied and disposed above the layered structure subjecting to the laser separation process. As a result, nearly all the residues from the blown out materials or dusts during the laser separation process can be immediately sucked away to leave a cleaned local region within each laser illumination spot. After all, each channel along the one or more cell-boundary regions have an exposed portion of the front surface region substantially free of residue particles and side walls also substantially free of residue particles. This is important because any residue particles falling on the cross-sectional region may cause electrical shorting or other damage to device.

Subsequently, one or more unit cells are formed with each of them being separated by the one or more cell boundary regions within the layered structure. As shown in FIG. 5, when the one or more channels are formed by the laser separation process (and associated cleaning process), multiple units 517 are formed from the layered structure by linking the one or more channels or trenches 515 to become one or more cell boundary regions. In a specific embodiment, each unit structure includes essentially the same one or more films of device materials sandwiched by the first conductive layer and the second conductive layer, and a peripheral side region free of layer-shorting particles from any residue of blown-out film materials. Therefore, each unit by itself is fully capable of performing all device functions as a single device. In one example, each unit cell acts as a thin film photovoltaic cell when the layered structure is one or more P-N junctions made of photovoltaic materials sandwiched by a bottom electrode layer and a top electrode layer.

Finally, the method 700 includes a process 726 for proving one or more unit cells for manufacture of a module device. In this process, one or more unit structure may be transferred out of the continuous layered structure from the substrate. In another case, one or more unit structure can be coupled to each other. In particular, each cross-sectional region is clean and free of layer-shorting particles. One or more electric connectors may be inserted into the channels or trenches at the cell boundary regions to couple either the top electrode layer (e.g., the second conductive layer) or a bottom electrode layer (e.g., the first conductive layer). For example, the coupling type of available plurality of unit cells can be electrically in series or electrically in parallel so that the solar module formed by the process can have different operation current/voltage characteristics. Furthermore, one unit cell in one module device may be further coupled to another unit cell in a neighboring module device to make a module system. In one example, the layered structure includes photovoltaic materials so that each unit cell can serve as a photovoltaic cell. The formation of one or more unit cells by the above process and further integration of such unit cells provide an advanced technique to attach or integrate the thin film photovoltaic cells to various types of surfaces including a whole outer surface of a building.

Figure 8:
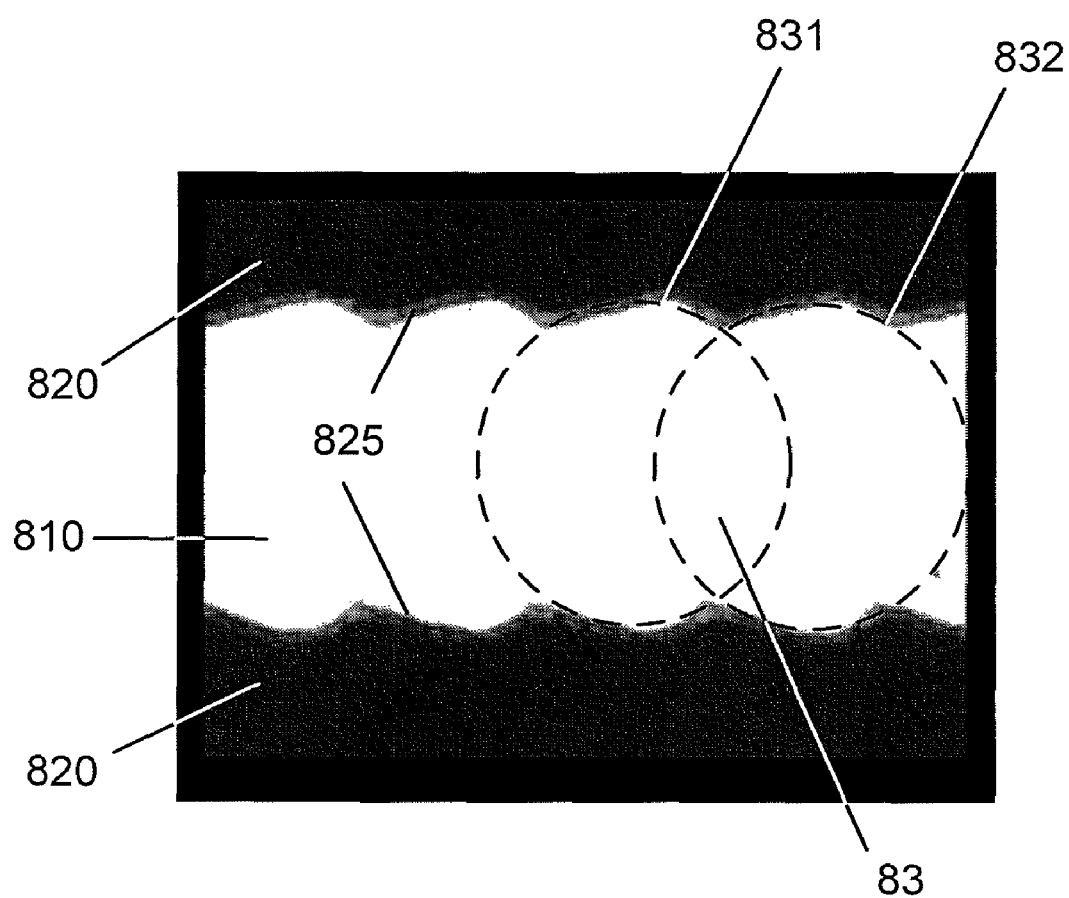
FIG. 8 is an exemplary optical microscope image of a channel formed in the thin film device by laser separation according to an embodiment of the present invention.

FIG. 8 is an exemplary optical microscope image of a channel formed in the thin film device by laser separation according to an embodiment of the present invention. This diagram is merely an example, which should not unduly limit the scope of the claims herein. One of ordinary skill in the art would recognize many variations, alternatives, and modifications. As shown, a channel 810 (bright color region) is formed by the laser separation process as a laser beam scans in one direction step by step across the thin film device 820 (dark color region) from the back surface region of the transparent substrate. Within the channel 810, the thin film material has been substantially removed from the transparent substrate, making it fully bright as illuminated by the microscope light. Beyond two edges 825, the thin film materials 820 remain intact (and opaque to the microscope illumination light) without any sign of crack and residual particle decoration, as evidenced by the sharp contrast of the edges. The two dashed circles 831 and 832 is schematically indicate the two subsequent beam spots during the scanning. For example, the beam scanning speed is about 4 meters per second. At each spot, the power up to 20 W laser irradiation is on with a pulse frequency of about 125 kHz. As shown, an overlapping region 83 has an estimate 20% population of each beam size (the beam diameter is about 3 mm). Of course, there can be many alternatives, variations, and modifications. For example, such scanning laser beam spots can be placed within the grid pattern preselected for manufacturing the multiple unit cells. A sequential two dimensional laser scanning can create desired patterns with desired widths as the boundary regions of the unit cells out of the continuous thin film on the substrate.

It is also understood that the examples and embodiments described herein are for illustrative purposes only and that various modifications or changes in light thereof will be suggested to persons skilled in the art. For example, embodiments according to the present invention have been specifically described for manufacture of a solar module using a laser separation process to form and provide one or more unit cells. But, ordinary skilled in the art should recognize that many variations of the thin film photovoltaic device structures can be still applied by the present invention. Additionally, embodiments of the invention can be applied to a much broader field other than the fabrication of solar module. Various modifications and changes can be included within the spirit and purview of this application and scope of the appended claims.

What is claimed is:

1. A method for manufacture of unit cells for thin film photovoltaic device, the method comprising:
    providing an optically transparent substrate having a thickness, a back surface region, and a front surface region including one or more grid-line regions;
    forming a layered structure including one or more films of photovoltaic materials overlying a metal layer, the metal layer overlying the front surface region;
    transferring the optically transparent substrate having the layered structure;
    aligning a laser beam from the back surface region through the thickness of the optically transparent substrate to illuminate a first region within the one or more grid-line regions;
    subjecting a portion of the metal layer overlying the first region to absorbed energy from the laser beam to separate a first portion of the layered structure from the first region;
    scanning the laser beam from the first region to a second region along the one or more grid-line regions to cause formation of one or more unit cells of the layered structure; and
    providing the one or more unit cells.

2. The method of claim 1 wherein the optically transparent substrate comprises a material made of glass, or acrylic, or quartz, or fused silica being transparent at least to the laser beam.

3. The method of claim 1 wherein aligning a laser beam from the back surface region through the thickness of the optically transparent substrate to irradiate a first region within the one or more grid-line regions comprises:
    generating a laser beam with a predetermined beam size; and
    directing the laser beam in a substantially vertical direction to the back surface region to pass through the thickness of the optically transparent substrate and illuminate the first region with the predetermined beam size.

4. The method of claim 3 wherein the laser beam comprises an output from a Q switched mode locked Nd: YAG laser source and characteristics of a wavelength ranging from 500 nm to 1200 nm, a homogeneous top-hat beam intensity profile, and energy density of about 50 W/cm$^2$.

5. The method of claim 4 wherein the Nd:YAG laser source is a pulsed laser source with a pulse length ranging from nanoseconds to milliseconds and a pulse duration ranging from microseconds to milliseconds.

6. The method of claim 1 wherein subjecting a portion of the metal layer overlying the first region to absorbed energy from the laser beam to separate a first portion of the layered structure from the first region comprises:
    converting absorbed energy from the laser beam by the portion of the metal layer at least partially into latent heat of sublimation;
    breaking the first portion of the layered structure free from the first region;
    forming a cross-sectional region of remaining portion of the layered structure along a direction substantially parallel to the laser beam;
    wherein,
    the first region and the cross-sectional region are substantially free of residues of the first portion of the layered structure.

7. The method of claim 1 wherein scanning the laser beam comprises changing direction of the laser beam with a mirror or moving the optically transparent substrate on a controlled stage relative to the laser beam.

8. The method of claim 7 wherein scanning the laser beam further comprises moving the laser beam in a step-by-step manner so that the laser beam at each step illuminates a first spot within a time equal to a laser pulse length, thereafter moves to a next step within a time equal to a pulse duration to illuminates a second spot, the second spot being spatially overlapped with the first spot at least by 10-15%.

9. The method of claim 1 wherein scanning the laser beam from the first region to a second region along the one or more grid-line regions comprises removing a plurality of portions of the layered structure by the laser beam, the plurality of portions of the layered structure including at least the first portion and being connected from the first region to the second region to cause a formation of one or more channels along the one or more grid-line regions, thereby forming one or more unit cells of the layered structure divided by the one or more channels.

10. The method of claim 9 wherein the one or more channels exposes a portion of the front surface region and cross-sectional regions of remaining portion of the layered structure, wherein the exposed portion of the front surface region and cross-sectional regions of remaining portion of the layered structure are substantially free of residues of the removed portion of the layered structure.

11. The method of claim 9 wherein the one or more channels comprises cell-to-cell spacing ranging from about 1 mm to about 20 mm and more.

12. The method of claim 1 wherein providing the one or more unit cells comprises transferring the one or more unit cells from the continuous sandwiched structure on the optically transparent substrate.

13. The method of claim 1 wherein providing the one or more unit cells further comprises coupling the one or more unit cells to each other electrically in series or in parallel for manufacture of a solar module.

* * * * *